(12) United States Patent
Quigley

(10) Patent No.: US 6,177,298 B1
(45) Date of Patent: Jan. 23, 2001

(54) ELECTROSTATIC DISCHARGE PROTECTION CIRCUIT FOR AN INTEGRATED CIRCUIT AND METHOD OF MANUFACTURING

(75) Inventor: John H. Quigley, Phoenix, AZ (US)

(73) Assignee: Motorola, Inc., Schaumburg, IL (US)

( * ) Notice: Under 35 U.S.C. 154(b), the term of this patent shall be extended for 0 days.

(21) Appl. No.: 09/017,139

(22) Filed: Feb. 2, 1998

Related U.S. Application Data

(63) Continuation-in-part of application No. 08/706,868, filed on Sep. 3, 1996, now Pat. No. 5,781,388.

(51) Int. Cl.[7] .......................... H01L 21/22; H01L 21/332
(52) U.S. Cl. .......................... 438/135; 438/203; 438/237; 438/548
(58) Field of Search .................... 438/135, 134, 438/139, 137, 548, 203; 257/355, 358

(56) References Cited

U.S. PATENT DOCUMENTS

| | | | |
|---|---|---|---|
| 5,272,097 | * 12/1993 | Shiota | 437/34 |
| 5,290,724 | * 3/1994 | Leach | 437/51 |
| 5,400,202 | 3/1995 | Metz et al. | 361/56 |
| 5,453,384 | * 9/1995 | Chatterjee | 437/6 |
| 5,528,188 | 6/1996 | Au et al. | 327/310 |
| 5,610,425 | 3/1997 | Quigley et al. | 257/358 |
| 5,708,288 | * 1/1998 | Quigly | 257/355 |

* cited by examiner

Primary Examiner—Carl Whitehead, Jr.
Assistant Examiner—David Goodwin
(74) Attorney, Agent, or Firm—Sharon K. Coleman; Lanny L. Parker

(57) ABSTRACT

An ESD protection circuit (11) includes a low capacitance diode (26), a voltage divider, a trigger transistor (16), and an SCR. Reducing the capacitance associated with the diode (26) makes the ESD protection circuit particularly suitable for RF applications. To form a low capacitance diode, the parasitic junction capacitance of the diode (26) is hidden in a like-doped well; for example, an N+ cathode (54) of the diode (26) may be folded or formed partially in an N-well (53). Because the N-well (53) does not form a junction with the N+ cathode, the junction capacitance associated with the portion of the N+ well lying inside the N-well is hidden or canceled by the N-well (53), thereby reducing the overall capacitance of the diode (26).

5 Claims, 2 Drawing Sheets

ELECTROSTATIC DISCHARGE PROTECTION CIRCUIT FOR AN INTEGRATED CIRCUIT AND METHOD OF MANUFACTURING

This application is a continuation-in-part of U.S. Ser. No. 08/706,868, filed Sep. 3, 1996, now U.S. Pat. No. 5,781,388 which is hereby incorporated-by-reference.

BACKGROUND OF THE INVENTION

This invention relates, in general, to high voltage protection circuitry for an integrated circuit, and more particularly, to electrostatic discharge (ESD) protection of an integrated circuit.

An integrated circuit is typically one element of a larger system comprising many circuits. Interconnection between integrated circuits takes many forms. For example, an integrated circuit is placed in a package where wire is bonded between the metal pads of the integrated circuit and leads of the package. The leads of the package typically couple to an integrated circuit board or integrated circuit socket. A high density interconnect format places solder balls on each metal pad of the integrated circuit. The integrated circuit is connected via the solder to corresponding metal pads on another substrate. In either case, the metal pads of an integrated circuit are the interface circuitry between circuitry external to the integrated circuit and circuitry internal to the integrated circuit.

It is inevitable that an integrated circuit is handled after wafer processing, during testing, packaging, and when placed in a system. Any handling of the integrated circuit exposes the device to an electrostatic discharge. Reliability and premature failure of an integrated circuit are a consequence of ESD. An ESD event produces extremely high voltages that can damage devices of the integrated circuit.

The pads or connection points are the pathway to circuitry internal to an integrated circuit. An ESD event applied to a pad couples a voltage typically exceeding a thousand volts to circuitry connected to the pad. The first circuit typically connected to a pad is either an Input or Output circuit. In general, an ESD event damages the Input/Output (I/O) circuitry if it is not protected by ESD protection circuitry. An ESD event is indiscriminate in its entry to the integrated circuit. The ESD event can be coupled to any I/O circuit of the integrated circuit or between I/O circuits of the integrated circuits.

In general, ESD protection circuitry is incorporated near the pad areas of an integrated circuit. The ESD protection circuitry dissipates an ESD event before harmful voltages or currents can damage circuitry of the integrated circuit. A problem with ESD protection circuitry is the protection mechanism is not reliable over all operating conditions. Both the breakdown mechanism (due to an ESD event) of a device in the I/O circuitry and the point at which the ESD protection circuitry is enabled is an important point of consideration in the development of an ESD circuit.

Another design factor in an ESD protection circuit is the area it takes up near a pad. Many integrated circuits are pad limited due to the high density available in today's integrated circuit processes. A high density ESD protection circuit would help in reducing die area and increasing pad density.

A further factor in ESD protection is the particular application of the device or circuitry to be protected. For example, a critical parameter for all radio frequency (RF) applications is sensitivity. Due to this sensitivity, RF I/O circuits either eliminate ESD protection or limit the protection to minimally acceptable levels to avoid the capacitance that is added to any circuit when adding additional devices and which adversely affects the sensitivity. However with RF applications becoming prevalent in the consumer market, to minimize costs such as actual circuit loss and subsequent board rework, ESD robustness for RF circuitry is a must.

It would be of great benefit if an ESD protection circuit could be provided that is easily manufacturable and provides protection from most ESD events that can occur on an integrated circuit. It would be of further benefit if an ESD protection circuit could be provided for RF applications.

BRIEF DESCRIPTION OF THE DRAWINGS

The present invention will be hereinafter described with reference to the drawing figures, wherein like numerals denote like elements or steps and wherein.

DETAILED DESCRIPTION OF THE DRAWINGS

In general, an Input/Output (I/O) circuit of an integrated circuit connects to a pad. The pad is a large conductive area that also serves as a physical connecting point, e.g., for a probe card (testing), wire bond, or solder ball. An integrated circuit may have hundreds or thousands of metal pads for external interconnection.

A problem with integrated circuits is that they are handled throughout the manufacturing and assembly process. An electrostatic discharge applied to any of the pads of the integrated circuit can produce substantial damage or affect reliability. The problem will remain undetected if the electrostatic discharge (ESD) event occurs after testing. Thus, a manufacturer could use the part in a system which would either not function or be unreliable in the field. This scenario is absolutely intolerable in today's manufacturing environment.

As is known, an ESD event enters through a metal pad and typically damages a device in an I/O circuit. Damage may also occur in the interior to the chip when the ESD event passes through the I/O circuit without being sufficiently attenuated. I/O circuits are typically located near the pads along the periphery of an integrated circuit for receiving and sending signals. To prevent damage to an integrated circuit, ESD protection circuitry is placed near each pad to sense and suppress the electrostatic discharge before the circuitry of an integrated circuit is damaged.

An ESD event is defined as a static discharged coupled to an integrated circuit. An ESD event is categorized in two ways. First, an ESD event can occur between any two pads of an integrated circuit, and second, an ESD event can occur between an integrated circuit and any other object.

The protection provided by ESD circuitry on an I/O circuit is typically measured using MIL-STD 883C or DOD-STD 1686A. An ESD tester provides an ESD event of a specific voltage and current waveform. The ESD tester provides an ESD event between any two pads (or groups of pads) of an integrated circuit. Thus, an ESD protection circuit must protect an integrated circuit from an ESD between any two I/O pads, an I/O pad to power supply line, or between the power supply lines.

Figure 1:
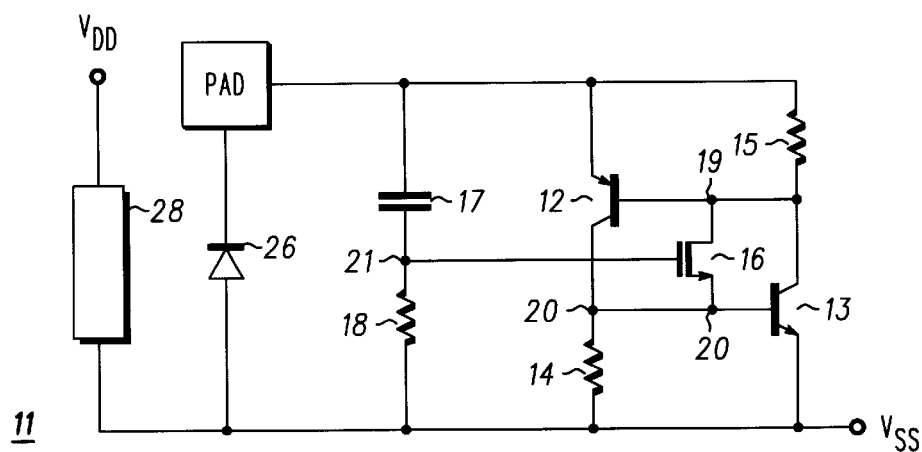
FIG. 1 is a schematic diagram of an electrostatic discharge (ESD) protection circuit coupled to a pad in accordance with an embodiment of the present invention.

To fully safeguard against ESD damage, preferably an ESD protection circuit provides protection both at the chip level and the pad level. FIG. 1 is a schematic diagram of an ESD protection circuit 11 in accordance with an embodiment of the present invention. In accordance with one aspect of the embodiment illustrated in FIG. 1, a bus clamp device or mechanism 28 provides chip level protection. Bus clamp device 28 may comprise a zener diode, a schmidt triggered field effect transistor, a zener triggered NPN transistor, a field oxide device, or the like. Bus clamp 28 has a first terminal coupled to a first power supply terminal $V_{SS}$ for receiving a first power supply voltage and a second terminal coupled to a second power supply terminal $V_{DD}$ for receiving a second power supply voltage. When a zener diode, for example, is used as bus clamp 28, an anode of the diode would be coupled to first power supply terminal $V_{SS}$ and a cathode of the diode would be coupled to second power supply terminal, $V_{DD}$. A fast response time, low leakage diode suitable for use as bus clamp 28 is described in commonly owned U.S. Pat. No. 5,610,425, Quigley, et al.

In accordance with another aspect of the invention, ESD protection circuit 11 provides pad level protection via a silicon controlled rectifier (SCR). An SCR is characterized by an extremely low impedance making it useful as an ESD protection element. An SCR is coupled to a pad of an integrated circuit and typically enabled by a trigger voltage. The SCR rapidly turns on once the trigger voltage is applied, allowing the SCR to react quickly. The low impedance of the SCR effectively shorts the ESD event to prevent a damaging voltage from being applied to any circuitry, thus preventing damage to the integrated circuit.

How an SCR is triggered varies between different ESD protection circuits. For example, a prior art ESD protection circuit utilizes a Field Effect Transistor (FET) to trigger an SCR. The mechanism for generating the trigger voltage is to allow the FET to breakdown or punch-through thereby coupling a voltage to the SCR. A problem with this method is that the FET would have to be scaled to insure it will breakdown or punch-through before other devices on the integrated circuit. Modifying the FET to breakdown or punch-through first requires additional wafer process steps adding cost and complexity to the manufacturing process. Alternately, the devices in close proximity to the pad (that are typically damaged by ESD) can be modified to have a higher breakdown voltage than the trigger FET but at a loss of performance.

The SCR pad level protection of ESD protection circuit 11 does not utilize device breakdown or punch-through as the trigger mechanism so it is operable each time an ESD event occurs. The SCR pad level protection of ESD protection circuit 11 is easily integrated on a semiconductor wafer and is small enough to be placed near a pad.

A preferred SCR in accordance with the present invention comprises transistors 12 and 13 and resistors 14 and 15. Transistors 12 and 13 each have a collector, a base, and an emitter respectively corresponding to a first electrode, a control electrode, and a second electrode. In accordance with the embodiment illustrated in FIG. 1, transistor 12 is a PNP bipolar transistor and transistor 13 is an NPN bipolar transistor and resistors 14 and 15 are parasitic resistances associated with an integrated SCR.

ESD protection circuit 11 further comprises capacitor 17, resistor 18, and transistor 16. Capacitor 17, resistor 18, and transistor 16 work cooperatively to trigger the SCR. Capacitor 17 has a first terminal connected to the pad and a second terminal connected to a node 21. Resistor 18 has a first terminal coupled to the second terminal of capacitor 17 and a second terminal coupled to the first power supply terminal. In accordance with the embodiment illustrated in FIG. 1, transistor 16 is an Insulated Gate Field Effect Transistor (IGFET). Transistor 16 has a drain, a gate, and a source respectively corresponding to a first electrode, a control electrode, and a second electrode. The drain is coupled to a first control input terminal or node 19 of the SCR, the gate is coupled to node 21, and the source is coupled to a second control input terminal or node 20 of the SCR.

The SCR is coupled between the pad and first power supply terminal $V_{SS}$. More particularly, transistor 12 has a collector coupled to control input terminal 20, a base coupled to control input terminal 19, and an emitter coupled to the pad. Transistor 13 has a collector coupled to control input terminal 19, a base coupled to control input terminal 20, and an emitter coupled to the first power supply terminal, $V_{SS}$. Resistor 14 has a first terminal coupled to node 20 and a second terminal coupled to first power supply terminal $V_{SS}$. Resistor 15 has a first terminal coupled to the pad and a second terminal coupled to the node 19.

In operation, ESD protection circuit 11 protects the integrated circuit from ESD events. At the chip level, bus clamp 28, for example, a zener diode, prevents an electrostatic discharge from increasing a voltage across the power supply lines of the integrated circuit. Zener diode 28 clamps the power supply lines, $V_{SS}$ and $V_{DD}$, preventing the lines from exceeding a damaging voltage. At the pad level, the SCR provides protection from positive ESD events.

A positive ESD event, a positive stress with respect to $V_{SS}$, on the pad enables the SCR. More particularly, an electrostatic discharge applied to the pad couples through capacitor 17 and generates a voltage across resistor 14 which is applied to the gate of transistor 16. Transistor 16, in turn, triggers the SCR, shorting the pad to the first power supply terminal, $V_{SS}$. The SCR shunts the electrostatic discharge to prevent a damaging voltage from being coupled to other circuitry coupled to the pad.

In accordance with another aspect of the invention, ESD protection circuit 11 provides further pad level protection via a diode 26. Diode 26 has a first terminal coupled to a pad of the integrated circuit and a second terminal coupled to the first power supply terminal, $V_{SS}$. Diode 26 provides protection from negative ESD events.

A negative ESD event, a negative stress with respect to $V_{SS}$, on the pad enables diode 26. Diode 26 protects the integrated circuit at the pad level by preventing a voltage at the pad from going below the negative most power supply line. Diode 26 becomes forward biased when the pad is coupled to a voltage less than a diode voltage drop below the power supply voltage, $V_{SS}$. The forward biased diode clamps a voltage at the pad to a diode voltage drop higher than the power supply voltage, $V_{SS}$, preventing damage to any circuitry coupled to the pad.

Figure 2:
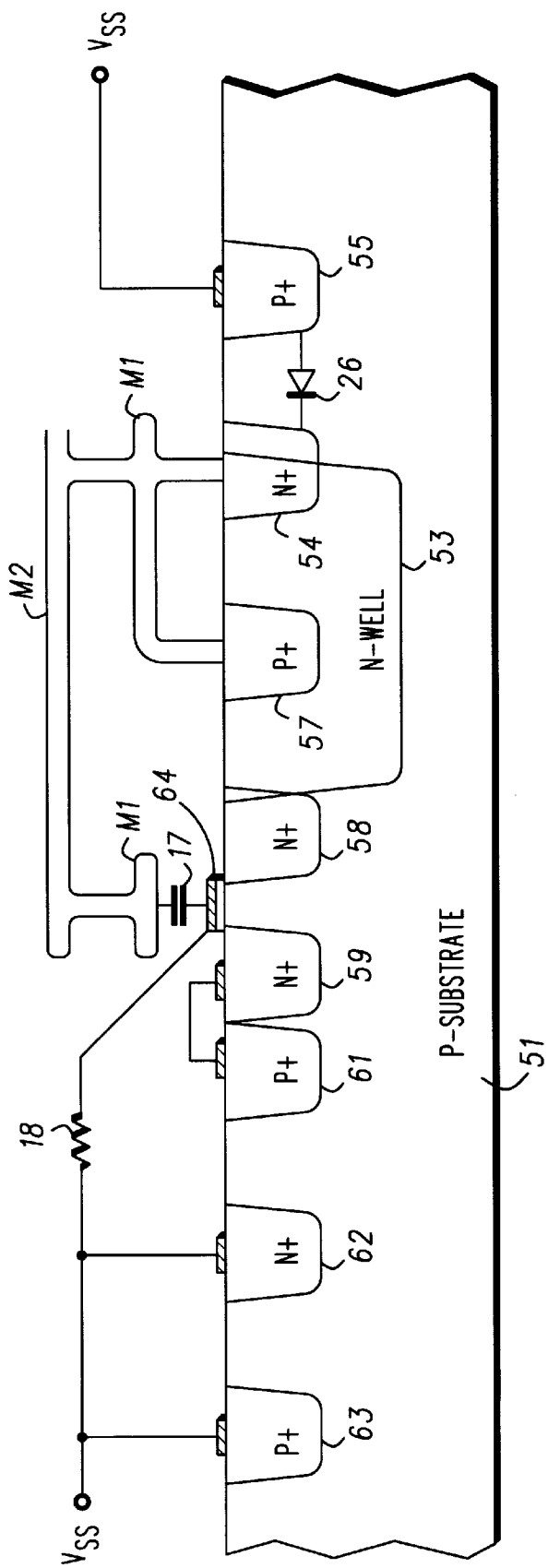
FIG. 2 is a partial cross-sectional view of an ESD protection circuit in accordance with the embodiment of FIG. 1.

FIG. 2 is a partial cross-sectional view of ESD protection circuit 11 in accordance with an embodiment of the present invention. ESD protection circuit 11 is formed in a P-substrate 51. Transistor 12 is a PNP transistor formed as a vertical device. A PNP vertical transistor corresponding to transistor 12 of FIG. 1 is formed by a P+ region 57 (emitter), an N-well 53 (base), and P-substrate 51 (collector). P+ region 57 couples to the pad. A resistance corresponding to resistor 14 is a parasitic resistance of P-substrate 51. The substrate resistance is measured from N-well 53 to a P+ region 63 (P-substrate contact). P+ region 69 is coupled for receiving a power supply voltage, $V_{SS}$.

In accordance with the embodiment illustrated in FIG. 1, transistor 13 is an NPN transistor formed as a lateral device. Referring again to FIG. 2, a lateral NPN transistor corresponding to transistor 13 of FIG. 1 is formed by N-well 53 (collector), P-substrate 51 (base), and an N+ region 62 (emitter). N+ region 62 is coupled for receiving the power supply voltage $V_{SS}$. N-well 53 is coupled to the pad by an N+ region 54. A resistance corresponding to resistor 15 of FIG. 1 is a parasitic resistance of N-well 53. The N-well resistance is measured from P+ region 57 to N+ region 54.

In accordance with the embodiment of FIG. 1, transistor 16 is an IGFET transistor. P-type IGFET transistors are formed in an N-well while N-type IGFET transistors are formed in the P-type substrate. A transistor corresponding to transistor 16 of FIG. 1 is formed by an N+ region 58 (drain) and an N+ region 59 (source). A thin layer of gate oxide isolates a polysilicon gate 64 from P-substrate 51. N+ region 59 is coupled to P-substrate 51 via a P+ region 61.

In accordance with a preferred embodiment of the present invention, capacitor 17 is integrated in the layout of transistor 16 which is an IGFET transistor having a polysilicon gate, gate 64. For ease of understanding how and where capacitor 17 is formed, a schematic representation of capacitor 17 is illustrated on FIG. 2. A capacitor corresponding to capacitor 17 of FIG. 1 and in accordance with the preferred embodiment is formed by gate 64 and the pad. In forming the pad, a first layer metal M1 is formed over portions of ESD protection circuit 11, including polysilicon gate 64. As known to those skilled in the art, additional metal layers, such as layer M2, are used in the formation of the pad. A silicon dioxide dielectric disposed over polysilicon gate 64 isolates first layer metal M1 from polysilicon gate 64, creating or forming capacitor 17. More particularly, gate 64 forms a first plate of the capacitor and a portion of first layer metal M1 overlying gate 64 forms a second plate of the capacitor. Forming a capacitor in accordance with this aspect of the invention results in the capacitor being integral with transistor 16 and integral with the pad. Forming an integral capacitor reduces the amount of substrate real estate necessary to implement ESD protection circuit 11.

A diode corresponding to diode 26 of FIG. 1 is formed by a junction formed between N+ region 54 and P-substrate 51. For ease of understanding how and where diode 26 is formed, a schematic representation of a diode is included on FIG. 2. N+ region 54 forms the cathode of diode 26 and P-substrate 51 forms the anode. P+ region 55 suitably provides the anode contact for diode 26. In accordance with this embodiment of the invention, N+ region 54 is formed partially within N-well 53 and, preferably, a majority of N+ region 54 is formed or disposed within N-well 53.

In an ESD protection circuit such as ESD protection circuit 11, diode 26 may be formed such that it is incorporated into another component or circuitry of the integrated circuit, such as an SCR. For example, as described herein, N+ region 54 is formed at least partially in N-well 53 which forms portions of the SCR. More particularly, N-well 53 forms the first electrode or the collector of transistor 13. N+ region 54 suitably provides the contact to the N-well 53 (to the collector). N+ region 54 also serves as the cathode and contact therefor of diode 26. Thus, diode 26 may be formed such that it shares a contact or terminal with the SCR. Forming diode 26 such that it is incorporated into or re-uses portions of other components or circuitry provides benefits such as reduced chip real estate and less parasitic junction capacitance, which is particularly important in RF applications, as will be discussed more fully below. Alternatively, N+ region may be formed as a stand-alone device in its own N-well without departing from the present invention.

Figure 3:
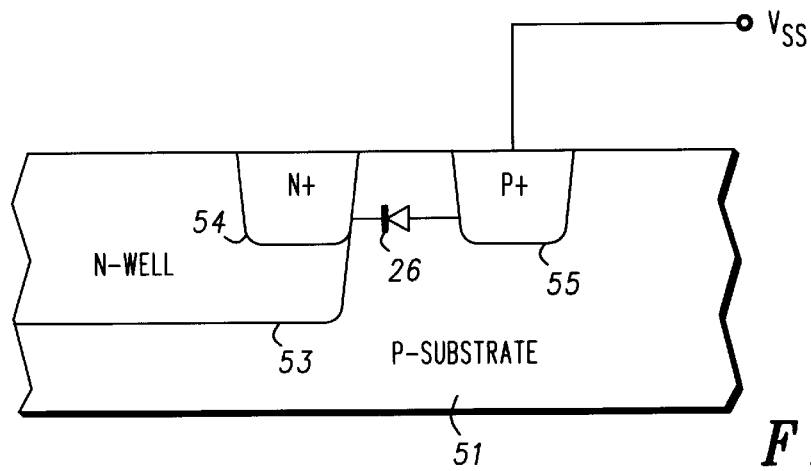
FIG. 3 is a partial cross-sectional view of a low capacitance diode in accordance with a preferred embodiment of the present invention.

FIG. 3 is a partial cross-sectional view of a low capacitance diode in accordance with a preferred embodiment of the present invention. FIG. 3 illustrates a diode corresponding to diode 26 of FIG. 1. In accordance with the preferred embodiment, diode 26 is formed by doping a portion of N-well 53 with an n-type dopant such that an N+ region 54 is formed within N-well 53 and an edge of N+ region is coincident with an edge of N-well 53. The coincident edge of N+ region 54 forms the cathode of diode 26 and P-substrate 51 forms the anode. As those skilled in the art will appreciate, in practice the ability to form N+ region 54 within N-well 53 such that an edge of N+ region 54 is coincident with an edge of N-well 53 is dependent on the photo lithographic limits or tolerances of the N+/N-well masking steps because the N+/N-well masking steps determine the width of the active area of the cathode, or, in other words, the amount of N+ region 54 that lays outside N-well 53. Accordingly, N+ region 54 may be formed such that an edge of N+ region 54 is within industry standard photo lithographic limits or tolerances of an edge of the N-well or, in other words, an edge of N+ region 54 is formed substantially coincident with an edge of N-well 53.

As noted, in many RF applications, ESD protection circuitry is often eliminated due to the adverse effects on the sensitivity of the circuitry. When ESD protection is included, typically minimal protection circuitry is used to reduce capacitive effects but resulting in minimal protection. In accordance with the preferred embodiment of the present invention, however, ESD protection circuit 11 provides protection circuitry suitable for use with RF circuitry. By forming diode 26 as discussed in reference to FIGS. 2 and 3, the anode-cathode junction area can be substantially reduced and thus the parasitic junction capacitance of the diode can be substantially reduced. By reducing the junction capacitance, the adverse effects on sensitivity are substantially reduced.

The junction capacitance of associated with the diode is the sum of the peripheral and plate capacitances. Forming diode 26 such that all but a minimal portion of the cathode resides within a like-doped well, such as an N+ cathode within an N-well, effectively hides or cancels the peripheral and plate capacitance of the portion of the N+ region laying within the N-well because there is not a P-N junction. Thus, the total parasitic capacitance due to diode 26 is reduced to that due to the portion of the N+ region laying outside the N-well or otherwise forming a junction with the P-substrate and that due to the N-well to P-substrate junction which is minute in comparison to the N+ region to P-substrate parasitic junction capacitance that would be present if diode 26 was formed using conventional techniques in which the cathode is not formed at least partially, and preferably substantially, within a like-doped well.

Moreover, when an SCR, such as that discussed herein, is used and when diode 26 is formed by re-using a portion of the SCR, the amount of parasitic junction capacitance added by the diode is limited to that due to the portion of the N+ region laying outside the N-well or otherwise forming a junction with the P-substrate. The parasitic capacitance associated with N-well to P-substrate junction is already present due to the SCR but is not affected by the inclusion of a diode formed as discussed in relation to diode 26. Thus, only the portion of the N+ region laying outside the N-well or otherwise forming a junction with the P-substrate contribute to the parasitic junction capacitance of diode 26.

As known to those skilled in the art, a diode's on-resistance is a dominant factor in determining the maximum voltage stress that the diode can withstand. Accordingly, to minimize the on-resistance, P+ region 55 should be formed at a minimum distance from N+ region 54. Moreover, the diode should be made as wide as necessary for a minimum on-resistance yet as narrow as possible for minimum capacitance. The minimum on-resistance and dimensions of diode 26 depend on what the particular application is required to withstand. While forming a majority of N+ region 54 within an N-well, such as N-well 53, reduces the parasitic junction capacitance, it is not preferred to form N+ region 54 completely within an N-well because doing so would result in an undesirably large on-resistance. Preferably, N+ region 54 is formed within an N-well such that an edge of the N+ region is substantially coincident with an edge of the N-well, as described in relation to FIG. 3.

The amount and type of ESD protection used will typically depend, particularly in RF applications, on the various requirements the circuitry being protected must meet. In some applications, it may not be possible or desirable to use both the SCR and diode 26 as discussed above. As an alternative to an SCR, if desirable or feasible, a second diode (not shown) may be used to provide protection from positive ESD events in conjunction with diode 26 which provides protection from negative ESD events as discussed above. In accordance with this aspect of the invention, diode 26 is formed as a stand-alone component or, if possible, by re-using a well of another component, as discussed in relation to FIGS. 2 and 3. The second diode would be coupled between the pad and the positive most power supply terminal to prevent a voltage at the pad from going above the positive most supply voltage. More particularly, a cathode of the diode couples to the positive most power supply terminal $V_{DD}$ for receiving the positive most power supply voltage. An anode of the diode couples to the pad. The diode becomes forward biased when the pad is coupled to a voltage greater than a diode voltage drop above the positive most power supply voltage, $V_{DD}$.

If it is not desirable or feasible to use either an SCR or second diode to provide protection from positive ESD events, negative protection alone may be used. In accordance with an alternate embodiment of the present invention, diode 26 provides pad level protection for an integrated circuit from negative ESD events. In accordance with this aspect of the invention, diode 26 is formed as a stand-alone component or, if possible, by re-using a well of another component, as discussed in relation to FIGS. 2 and 3. As should be evident from the description of diode 26 in relation to FIGS. 1–3, diode 26, while particularly suitable for providing ESD protection for RF and other circuitry, is not limited to ESD protection. Because of the reduced parasitic capacitance resulting from forming a diode in accordance with the principles of the present invention, diode 26 is particularly suitable and may be preferred in any application requiring diodes but susceptible to the adverse affects of parasitic junction capacitances.

Referring again to FIG. 1, in a typical application of ESD protection circuit 11, the circuitry connected to the pad is IGFET based circuitry. Of immediate concern is the I/O circuitry typically coupled to the pad. The I/O circuitry is the first to be damaged due to its proximity to the pad. In general, damage to circuitry (for example, output driver devices or input receiver circuitry) connected to the pad is due to gate oxide breakdown or thermal junction damage. ESD protection circuit 11 is enabled before gate oxide is damaged by an ESD event. The SCR has an extremely low impedance that effectively discharges the energy of the ESD event without producing a voltage that could damage circuitry on the integrated circuit. This lower clamping voltage also reduces the power dissipated in the junction, thereby limiting exposure to thermal damage.

Capacitor 17 and resistor 18 form a voltage divider circuit or network for generating a control voltage, via transistor 16, to the SCR due to a transient voltage applied to the pad. Transistors 12 and 13 form a positive feedback network where collector current from transistor 12 drives the base of transistor 13 and the collector current from transistor 13 drives the base of transistor 12. Resistors 14 and 15 are parasitic resistances due to the layout of the SCR. Typical values for resistor 14 and 15 are respectively 10 ohms and 2000 ohms. Both resistors 14 and 15 have a resistance that does not significantly effect the performance of the SCR and thus are not included in calculations, but one should be aware that the resistance exists and to take it into account should either resistor 14 or 15 have a high value.

Two factors relate to the operation of the voltage divider comprising capacitor 17 and resistor 18. First, the SCR should not trigger when normal signals are applied to the pad. Second, the voltage divider should trigger the SCR if an ESD event occurs at the pad. Both a normal signal and an ESD event produce a voltage transient which generates a voltage at node 21. A representation of an ESD event is needed before values of capacitor 17 and resistor 18 are calculated.

Figure 4:
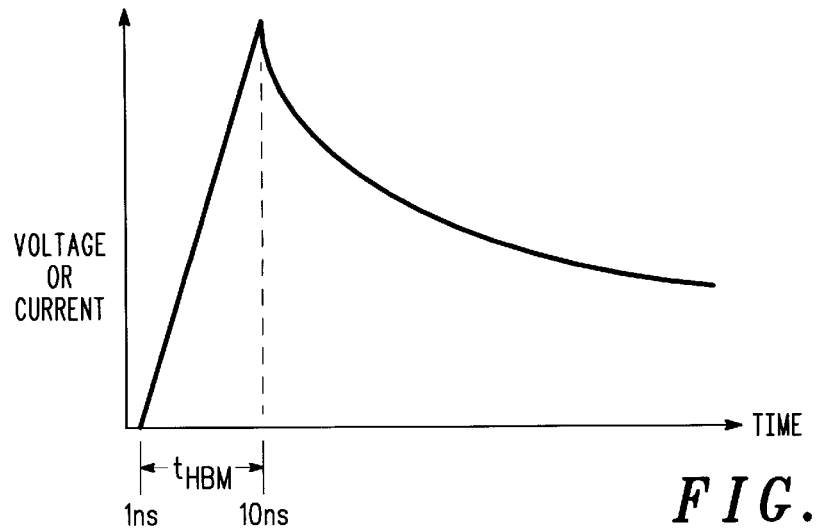
FIG. 4 is a graph of a Human Body Model ESD event.

A well known model for an electrostatic discharge is the Human Body Model (HBM). The Human Body Model represents an ESD event through a series Resistor/Capacitor (RC) circuit which represents a person touching one pin of an integrated circuit. The ESD event also has a common return point to complete the circuit path for the person (RC circuit) and the integrated circuit through another pin. FIG. 4 is a graph of a Human Body Model ESD event. An HBM ESD event is characterized by a fast rising voltage or current transient which has a rise-time $t_{HBM}$ between 1 nanosecond and 10 nanoseconds. Voltage levels for an ESD event are on the order of hundreds or thousands of volts. ESD protection circuit 11 of FIG. 1 must trigger and shunt an HBM ESD event for the rise-time $t_{HBM}$ described hereinabove.

As mentioned previously, an ESD event in an IGFET based integrated circuit damages gate oxide. Empirical analysis of a gate oxide breakdown indicates that a damage occurs at a higher voltage for a voltage transient than a DC voltage. For clarity and illustration purposes, it is best to use an example of a typical semiconductor wafer process to determine values for capacitor 17 and resistor 18 of ESD protection circuit 11 of FIG. 1. For example, an IGFET wafer process having gate lengths of 0.8 microns utilizes a gate oxide having a thickness of 100 angstroms. Empirical analysis has indicated that gate oxide breakdown occurs when a 10 volt DC voltage is applied across the gate oxide or a 20 volt transient voltage. Referring back to FIG. 1, ESD protection circuit 11 must enable SCR 22 before the pad reaches 20 volts because an ESD event is a transient phenomenon corresponding to the higher voltage for gate oxide breakdown.

Although gate oxide can withstand a 20 volt transient, a voltage, for example 12 volts, is selected as a trigger voltage (Vtrigger) which provides a significant margin for error in insuring ESD protection circuit 11 is enable during an ESD event. The voltage Vtrigger is a voltage at the pad. As mentioned previously, resistors 14 (10 ohms) and 15 (2000 ohms) do not have a significant impact on the design of ESD protection circuit 11 and thus are not included in the calculations.

Transistor 16 is enabled for turning on transistor 12 and assisting in the turn on of transistor 13 when a voltage at node 21 exceeds a threshold voltage of transistor 16. A typical threshold voltage for a device of this type is 0.5 volts (Vth). As noted, capacitor 17 (C17) and resistor 18 (R18) form a voltage divider network. The voltage divider network under transient conditions generates a voltage at node 21 (V21) corresponding to equation 1:

$$V21 = V/trigger * (R18/(R18 + (1/\omega * C17)))  \quad (1)$$

where Vtrigger is the voltage at the pad and $\omega$ equals $2\pi f$ (f=frequency). In this example, the trigger voltage is 12 volts (v) and the voltage at node 21 at the trigger voltage is 0.5 volts (the threshold voltage of transistor 16).

An option available to a designer of ESD protection circuit 11 is selecting a value for resistor 18 and solving equation 1 for capacitor 17 or selecting a value for capacitor 17 and solving equation 1 for resistor 18. In this example, it is beneficial to integrate capacitor 17 in the layout for transistor 16, as discussed in reference to FIG. 2. Transistor 16 is an IGFET having a polysilicon gate. An efficient method for making capacitor 17 is to form first layer metal M1 over the polysilicon gate of transistor 16. A silicon dioxide dielectric isolates the first layer metal from the polysilicon. The first layer metal forms the top plate of capacitor 17 and the polysilicon gate forms the bottom plate of capacitor 17. For example, transistor 16 formed in the process described hereinabove would have a polysilicon gate area that would produce a capacitance of 15 femtofarads (fF) with the first layer metal. Forming capacitor 17 in this manner allows ESD protection device 11 to have the smallest possible size.

It should be noted that equation 1 has a frequency term $\omega = 2\pi f$. A voltage transient is not a pure frequency. Voltage transients are commonly converted to a frequency in applications such as transmission line calculations to determine if fast rise times can be transmitted. The worst case scenario for a Human Body Model ESD event is a rise time ($t_r(esd)$) of 10 nanoseconds (ns). The 10 nanosecond rise time corresponds to the worst case energy that must be discharged by ESD protection circuit 11. Equation 2 is a rise time to frequency conversion equation for an ESD event.

$$f_{esd} = 0.37/t_r(esd) \quad (2)$$

Solving equation 1 for resistor 18 and utilizing equation 2 for the frequency term yields equation 3.

$$R18 = (1/(2p\, f_{esd} * C18)) * (1/((Vtrigger/V21) - 1)) \quad (3)$$

Plugging in the values for the variables of equation 3 ($f_{esd}=0.37/10$, C18=15 fF, Vtrigger=12 v, and V21=0.5 v) yields a resistor value (R18) of 12.5 kilo-ohms.

The speed at which a Silicon Controlled Rectifier (SCR) triggers corresponds to a delay in shunting an ESD event. A first order approximation of a SCR time constant expression is illustrated using parameters of the 0.8 micron gate length IGFET process described hereinabove. In the example, IGFET process a P-type substrate is used. P-type IGFET transistors are formed in a N-well while N-type IGFET transistors are formed in the P-type substrate.

As discussed in reference to FIGS. 1 and 2, the SCR comprises bipolar transistors 12 and 13. Transistor 13 is a NPN transistor formed as a lateral device. Transistor 13 comprises a N+ region as the emitter, the P-type substrate as the base, and a N-well as the collector. Both the N+ region and the N-well are formed in the P-type substrate. Transistor 12 is a PNP transistor formed as a vertical device. Transistor 12 comprises a P+ region as the emitter, the N-well is the base, and the P-type substrate is the collector. The P+ region (emitter of PNP) is formed in the N-well. Note that the N-well is the collector of the NPN transistor and the base of the PNP transistor. Similarly, the P-type substrate is the collector of the PNP transistor and the base of the NPN transistor. The vertical PNP transistor is the high gain device of SCR 22. Transistor 16 pulls base current out of transistor 12 to start the positive feedback between transistors 12 and 13.

In the example process, transistor 13 is a lateral NPN transistor having a transistor base width (Wp) of 8 microns. The base width of transistor 13 is defined as the distance from the N-well (collector) to the N+ emitter. The base mobility $\mu_p$ for the NPN transistor is 150(centimeters$^2$/volt*second). The NPN transistor base diffusion coefficient Dp is 0.26(volt*micron).

Transistor 12 is a vertical PNP transistor having a transistor base width (Wn) of 1.0 microns. The base width of transistor 12 is defined as the distance between the P+ emitter and the P-type substrate. The base mobility $\mu_n$ for the PNP transistor is 400(centimeters$^2$/volt*second). The PNP transistor base diffusion coefficient Dn is 0.26(volt*micron).

The time constant $t_{NPN}$ for the NPN transistor is defined by equation 4.

$$t_{NPN} = Wp^2/(2*Dp) \quad (4)$$

Plugging in the numbers for the example process yields $t_{NPN}$ of 86 nanoseconds.

The time constant $t_{PNP}$ for the PNP transistor is defined by equation 5.

$$t_{PNP} = Wn^2/(2*Dn) \quad (5)$$

Plugging in the numbers for the example process yields $t_{PNP}$ of 0.5 nanoseconds. The lateral NPN transistor is significantly slower than the vertical PNP transistor as should be expected.

The first order SCR time constant $t_{SCR}$ is defined as the square root of the product of the NPN and PNP transistor time constants as shown in equation 6.

$$t_{SCR} = (t_{NPN} * t_{PNP})^{1/2} \quad (6)$$

Using the values for the time constants calculated in equations 4 and 5 yields an SCR time constant of 6.4 nanoseconds. Although the HBM ESD model may be as fast as 1 nanosecond as described hereinabove, the fact remains that other ESD protection devices such as diodes commonly placed at the pad and power busses distribute the initial transient portion of an ESD event across the entire capacitance of an integrated circuit thereby significantly slowing the transient. This allows the SCR to work under all conditions under the Human Body Model.

The time constant for the SCR is important because it defines the minimum voltage transient duration required to enable the SCR. In other words, the SCR should not enable when normal signals are applied to the pads of an integrated circuit. Resolving equation 1 the voltage at the pad (Vtrigger) yields equation 7.

$$Vtrigger = V21 * (1 + (1/(R18 * \omega * C17))) \quad (7)$$

In this example, the time constant for the SCR is placed in equation 7 for the equivalent frequency of a voltage transient. Equation 8 defines the minimum voltage transient required for the SCR to trigger.

$$Vtrigger = V21*(1+(t_{SCR}/(2\pi*0.37*R18*C17))) \quad (8)$$

Solving equation 8 yields a value of 7.9 volts as a minimum voltage to trigger the SCR. Thus, under normal operating conditions of an integrated circuit using this process (3 volt signal levels), it is impossible to trigger the SCR independent of the speed of the voltage transient.

By now it should be appreciated that an ESD protection circuit has been provided that prevents ESD damage when an ESD event is applied to a pad of an integrated circuit. Particularly, an ESD protection circuit suitable for use in RF application has been provided. Protection from negative ESD events is provided by a diode having low parasitic capacitance. By folding the diode's cathode into a like-doped well, the parasitic junction capacitance is substantially reduced, making the diode particularly suitable as an ESD protection mechanism for RF applications. Protection from positive ESD events is provided by a dynamically triggered SCR. The ESD protection circuit does not use a device breakdown as a trigger mechanism for an SCR. A voltage divider circuit comprising a capacitor and resistor is used to apply a voltage for enabling the SCR in an ESD event. The voltage divider circuit must trigger for a model range of an ESD event yet it must not trigger for signals applied to or provided by the integrated circuit. To achieve this criteria, the SCR is designed to trigger at a voltage significantly greater than the operating voltage of the integrated circuit based on a worst case model of a voltage transient of an ESD event. The delay time of the SCR is made sufficiently long as to prevent normal signals of the integrated circuit from triggering the SCR. Thus, a method for producing a reliable, accurate, and simple to manufacture ESD protection circuit has been provided that works over a wide range of operating conditions.

I claim:

1. A method of manufacturing an electrostatic discharge (ESD) protection circuit for an integrated circuit comprising the steps of:

providing a semiconductor substrate of a first conductivity type;

doping a portion of the semiconductor substrate with a dopant of a second conductivity type to form a first doped region;

doping a portion of the semiconductor substrate and a portion of the first doped region with a dopant of the second conductivity type to form a second doped region;

doping a portion of the first doped region with a dopant of the first conductivity type to form a third doped region that is an emitter of a first transistor, the base of the first transistor formed by the first doped region and the collector formed by the substrate;

doping portions of the semiconductor substrate with a dopant of the second conductivity type to form a fourth doped region that is an emitter of a second transistor, the base of the second transistor formed by the substrate and the collector formed by the first doped region; and doping portions of the semiconductor substrate with a dopant of the first conductivity type to form a fifth doped region for contacting an anode of the diode formed between the substrate and the second doped region.

2. The method of claim 1 further comprising the steps of:

forming a capacitor on the semiconductor substrate;

forming a resistor coupled to the capacitor on the semiconductor substrate, wherein the capacitor and resistor form a voltage divider network; and forming a third transistor having a control electrode coupled to a common connection of the resistor and capacitor, a first electrode coupled to the base of the first transistor, and a second electrode coupled to the base of the second transistor.

3. The method of claim 2 further comprising the step of forming the capacitor integral with the control electrode of the third transistor.

4. A method of configuring an electrostatic discharge (ESD) protection circuit for an integrated circuit comprising the steps of:

connecting first and second transistors as a silicon controlled rectifier (SCR) where an emitter and base of the first transistor are coupled to a collector of the second transistor and an emitter and base of the second transistor are coupled to a collector of the first transistor;

providing a serial connection of a capacitor and a resistor between the emitters of the first and second transistors; and connecting a control terminal of a third transistor to a common connection of the resistor and the capacitor and current conduction terminals to the bases of the first and second transistors.

5. The method of claim 4, further including the step of coupling a diode between the emitter of the first transistor and the emitter of the second transistor.

* * * * *